(12) United States Patent
Gregoire

(10) Patent No.: US 12,707,705 B2
(45) Date of Patent: Aug. 11, 2026

(54) SILICIDING METHOD

(71) Applicant: STMicroelectronics (Crolles 2) SAS, Crolles (FR)

(72) Inventor: Magali Gregoire, Crolles (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 177 days.

(21) Appl. No.: 18/102,316

(22) Filed: Jan. 27, 2023

(65) Prior Publication Data

US 2023/0170260 A1 Jun. 1, 2023

Related U.S. Application Data

(63) Continuation of application No. 16/412,959, filed on May 15, 2019, now abandoned.

(30) Foreign Application Priority Data

May 23, 2018 (FR) ...................................... 1870591

(51) Int. Cl.

| | |
|---|---|
| ***H10D 84/01*** | (2026.01) |
| ***H10D 64/01*** | (2025.01) |
| ***H10D 84/03*** | (2025.01) |
| ***H10P 30/20*** | (2026.01) |
| ***H10P 95/90*** | (2026.01) |

(52) U.S. Cl.

CPC ....... *H10D 84/013* (2025.01); *H10D 64/0112* (2026.01); *H10D 84/038* (2025.01); *H10P 30/204* (2026.01); *H10P 30/208* (2026.01); *H10P 95/90* (2026.01)

(58) Field of Classification Search

None

See application file for complete search history.

(56) References Cited

U.S. PATENT DOCUMENTS 7,378,323 B2 5/2008 Chen
2004/0132249 A1 7/2004 Mitsuda et al.
(Continued)

OTHER PUBLICATIONS

Bing-Yue Tsui et al: “Improvement of the Thermal Stability of NiSi by Germanium Ion Implantation”, Journal of the Electrochemical Society, vol. 157, No. 2, 1 janvier 2010 (Jan. 1, 2010), pp. H137, XP055540554, ISSN: 0013-4651, DOI: 10.1149/1.3261582 * page H140, colonne de gauche; figure 7 *.
(Continued)

*Primary Examiner* — Jack S Chen
(74) *Attorney, Agent, or Firm* — Crowe & Dunlevy LLC

(57) ABSTRACT

An integrated circuit includes first semiconductor regions each having a silicided portion with group-III, group-IV, and/or group-V atoms implanted therein. In each first semiconductor region, a concentration of the group-III, group-IV, and/or group-V atoms is maximum at an interface between the silicided portion and a non-silicided portion. Other semiconductor regions in the integrated circuit each include a silicided portion also having group-III, group-IV, and/or group-V atoms implanted therein. The silicided portions of the first semiconductor regions are thicker than the silicided portions of the other semiconductor regions. The group-III, group-IV, and/or group-V atoms of the first semiconductor regions and of the other semiconductor regions may be carbon and/or germanium atoms.

9 Claims, 2 Drawing Sheets

(56) References Cited

U.S. PATENT DOCUMENTS

| | | | |
|---|---|---|---|
| 2005/0042831 | A1 | 2/2005 | Mehrotra |
| 2010/0320546 | A1 | 12/2010 | Tamura |
| 2012/0292670 | A1 | 11/2012 | Cai et al. |
| 2018/0068857 | A1 | 3/2018 | Adusumilli et al. |
| 2019/0363021 | A1* | 11/2019 | Gregoire .............. H10D 84/013 |

OTHER PUBLICATIONS

INPI Search Report and Written Opinion for FR 1870591 dated Jan. 11, 2019 (8 pages).

Ishigaki T et al: “Wide-range threshold voltage controllable silicon on thin buried oxide integrated with bulk complementary metal oxide semiconductor featuring fully silicided NiSi gate electrode”, Japanese Journal of Applied Physics, Japan Society of Applied Physics, Japan Society of Applied Physics, JP, vol. 47, No. 4, 1 avril 2008 (Apr. 1, 2008), pp. 2585-2588, XP001518610, ISSN: 0021-4922, DOI: 10.1143/JJAP.47.2585* Figure 1 *.

* cited by examiner 3
5
21
21
19
29
27
29
17
17
31
31
25
31
13
13
15
23
23
7
9
1
11
LV
HV 3
33
5
19
27
17
17
25
31
31
13
13
15
23
23
7
9
1
11
LV
HV 3
35
33
35
27a
5
19
27
17
17
23a
25
23a
31
13
13
15
23
23
7
9
11
LV
HV

SILICIDING METHOD

PRIORITY CLAIM

This application is a continuation of U.S. patent application Ser. No. 16/412,959, filed May 15, 2019, which claims the priority benefit of French Application for Patent No. 1870591, filed on May 23, 2018, the contents of both of which are hereby incorporated by reference in their entireties to the maximum extent allowable by law.

TECHNICAL FIELD

The present disclosure generally concerns the manufacturing of integrated circuits and, more particularly, the forming of silicide in such integrated circuits.

BACKGROUND

During the manufacturing of integrated circuits, a step of siliciding regions comprising silicon, which are intended to form electric contact areas, is generally provided, in order to decrease their resistivity.

SUMMARY

An embodiment overcomes all or part of the disadvantages of conventional siliciding methods.

An embodiment provides a siliciding method enabling obtainment of a Schottky barrier between the silicon and the formed silicide which is decreased as compared with the case where the silicide is formed by a conventional method.

An embodiment provides a method enabling forming of a silicide of low resistance in certain regions and a thin silicide in other regions.

An embodiment provides forming, in source and drain regions of a transistor, a thin silicide which causes no degradation of the transistor performance.

Thus, an embodiment provides an integrated circuit where first semiconductor regions each include a silicided portion having group-III, IV, and/or V atoms.

According to an embodiment, the atoms are carbon and/or germanium atoms.

According to an embodiment, in each first region, the concentration of the atoms is at a maximum level at the interface between the silicided portion and a non-silicided portion.

According to an embodiment, other semiconductor regions each include a silicided portion having group-III, IV, and/or V atoms, preferably carbon and/or germanium atoms.

According to an embodiment, the silicided portion of the first regions is thicker than the silicided portion of the other regions.

Another embodiment provides a method of manufacturing a circuit such as defined hereabove.

According to an embodiment, the method includes, from a wafer at least partially made of a semiconductor material having the first and second regions defined therein, the following steps: a first siliciding of the first regions; a simultaneous implantation in the first silicided regions and in the second regions; and a second siliciding of the second regions.

According to an embodiment, the first siliciding includes the masking of the second regions followed by the deposition of a first metal layer, preferably including nickel.

According to an embodiment, the second siliciding includes the deposition of a second metal layer, preferably including nickel, on the second regions.

According to an embodiment, the first metal layer is thicker than the second metal layer.

According to an embodiment, the second metal layer is also deposited on the first silicided regions.

According to an embodiment, the first siliciding includes a first anneal and the second siliciding includes a second anneal performed at a temperature lower than a temperature of the first anneal, the duration of the second anneal being preferably smaller than a duration of the first anneal.

According to an embodiment, the trench includes a stack of a semiconductor layer, an insulating layer, and a semiconductor substrate, the second regions forming part of components formed inside and/or on top of the semiconductor layer.

According to an embodiment, the thickness of the semiconductor layer is smaller than 20 nm.

According to an embodiment, the first regions form part of components formed inside and/or on top of the substrate.

According to an embodiment, the implantation is a carbon and/or germanium implantation.

According to an embodiment, the first and second regions include silicon.

According to an embodiment, the implantation is amorphizing.

Also disclosed herein is a method of manufacturing an integrated circuit, including: providing a semiconductor wafer including first and second semiconductor regions, the first semiconductor region including an insulating layer on top of and in contact with the semiconductor wafer and a silicon layer on top of and in contact with the insulating layer, with the silicon layer and insulating later forming a silicon-on-insulator structure; forming first and second transistors respectively within the first and second semiconductor regions; wherein the first transistor has source and drain regions separated by a channel-forming region, with the source region, drain region, and channel-forming region being formed in the insulating layer; the source and drain regions each including a portion of silicon epitaxially grown from the silicon layer such that the source and drain regions are raised with respect to a surface of the semiconductor wafer, the channel-forming region being topped by a gate stack, and first spacers covering sides of the gate stack to separate and electrically insulate the gate stack from the epitaxial portion; and wherein the second transistor has source and drain regions separated by a channel-forming region, with the source region, drain region, and channel-forming region being formed in the semiconductor wafer, the channel-forming region being topped with a gate stack, and second spacers covering sides of the gate stack.

The method further includes: depositing a mask over the first and second semiconductor regions such that the mask covers the first and second transistors, and etching a portion of the mask covering the second semiconductor region; and performing a first siliciding in the second semiconductor region to form first silicided regions. The first siliciding is performed by: depositing a first metal layer in the first and second semiconductor regions, with the first metal layer in the first semiconductor region being deposited to directly contact the mask and in the second semiconductor region being deposited to directly contact the gate stack, second spacers, and source and drain regions of the second transistor; and performing a first annealing so that the first metal layer reacts with silicon in the second semiconductor region that the first metal layer is in contact with to form silicided regions atop the source and drain regions of the second transistor as well as to form silicided regions atop the gate stack of the second transistor.

The method additionally includes: removing the first metal layer and the mask to expose in the first semiconductor region, regions atop the source and drain regions of the first transistor as well as a region atop the gate stack of the first transistor; performing an implantation on the silicided regions within the second semiconductor region and the regions to be silicided in the first semiconductor region, the implantation within the first semiconductor region being into the epitaxial portions of the source and drain regions of the first transistor; wherein the implantation is amorphizing and breaks a crystal structure of the second semiconductor region across a given thickness thereof extending from an exposed surface of the second semiconductor region down to a given depth, wherein the given thickness is less than a total thickness of the second semiconductor region; and performing a second siliciding in the first semiconductor region to form second silicided regions. The second siliciding is performed by: depositing a second metal layer over the first and second semiconductor regions, with the second metal layer; and performing a second annealing so that the second metal layer reacts with silicon in the first and second semiconductor regions that the second metal layer is in contact with to thereby form silicided regions atop the epitaxial portions of the source and drain regions of the first transistor as well as form silicided region atop the gate stack of the first transistor.

The method also includes: removing the second metal layer to remove unreacted portions thereof, and performing a third annealing to favor, in the second semiconductor region, accumulation of atoms implanted during the implantation at an interface between silicided regions and the silicon on which they rest and at an interface between silicided region and the silicon on which it rests.

A width of the second spacers may be greater than a width of the first spacers.

The formed silicon-on-insulator structure may result in the first transistor operating in a fully depleted mode such that the silicon layer and insulating layer form a fully-depleted silicon-on-insulator structure.

The method may further include forming an insulating wall in the semiconductor wafer to separate and insulate the first and second transistors from one another.

The second annealing may be shorter and carried out at a lower temperature than the first anneal so that the second anneal does not modify thickness and composition of the silicided regions formed during the first annealing.

The third annealing may be longer than the second annealing but shorter than the first annealing and is carried out a temperature higher than the first and second annealings.

The removal of the first and second metal layers may be performed by wet etching.

The first transistor may be a low-voltage transistor and the second transistor is a high-voltage transistor.

As a result of the implantation being performed within the first semiconductor region into the epitaxial portions of the source and drain regions of the first transistor, PN junctions of the first transistor are not modified by the implantation due to a distance between the PN junctions of the transistor and the epitaxial portions of the source and drain regions of the first transistor.

BRIEF DESCRIPTION OF THE DRAWINGS

The foregoing and other features and advantages will be discussed in detail in the following non-limiting description of specific embodiments in connection with the accompanying drawings, among which

FIG. 1 is a simplified cross-section view of a portion of a wafer at least partially made of a semiconductor material, during a step of a manufacturing method disclosed herein;

FIG. 2 is a simplified cross-section view showing the structure of FIG. 1 after the forming of a mask at least on the low voltage portion of the wafer but not on its high voltage portion;

FIG. 3 is a simplified top view showing the structure of FIG. 2 after a first siliciding step, the first siliciding being performed in the high voltage portion of the wafer but not in its low voltage portion;

FIG. 4 is a simplified cross-section view of the structure of FIG. 3 after the removal of the metal layer and of the mask, during an implantation step carried out simultaneously for the high voltage and low voltage portions of the wafer; and FIG. 5 is a simplified cross-section view showing the structure of FIG. 4 after a second siliciding step during which, in the low voltage portion of the wafer, silicide is formed in exposed silicon regions.

DETAILED DESCRIPTION

Figures 1, 2, 3:
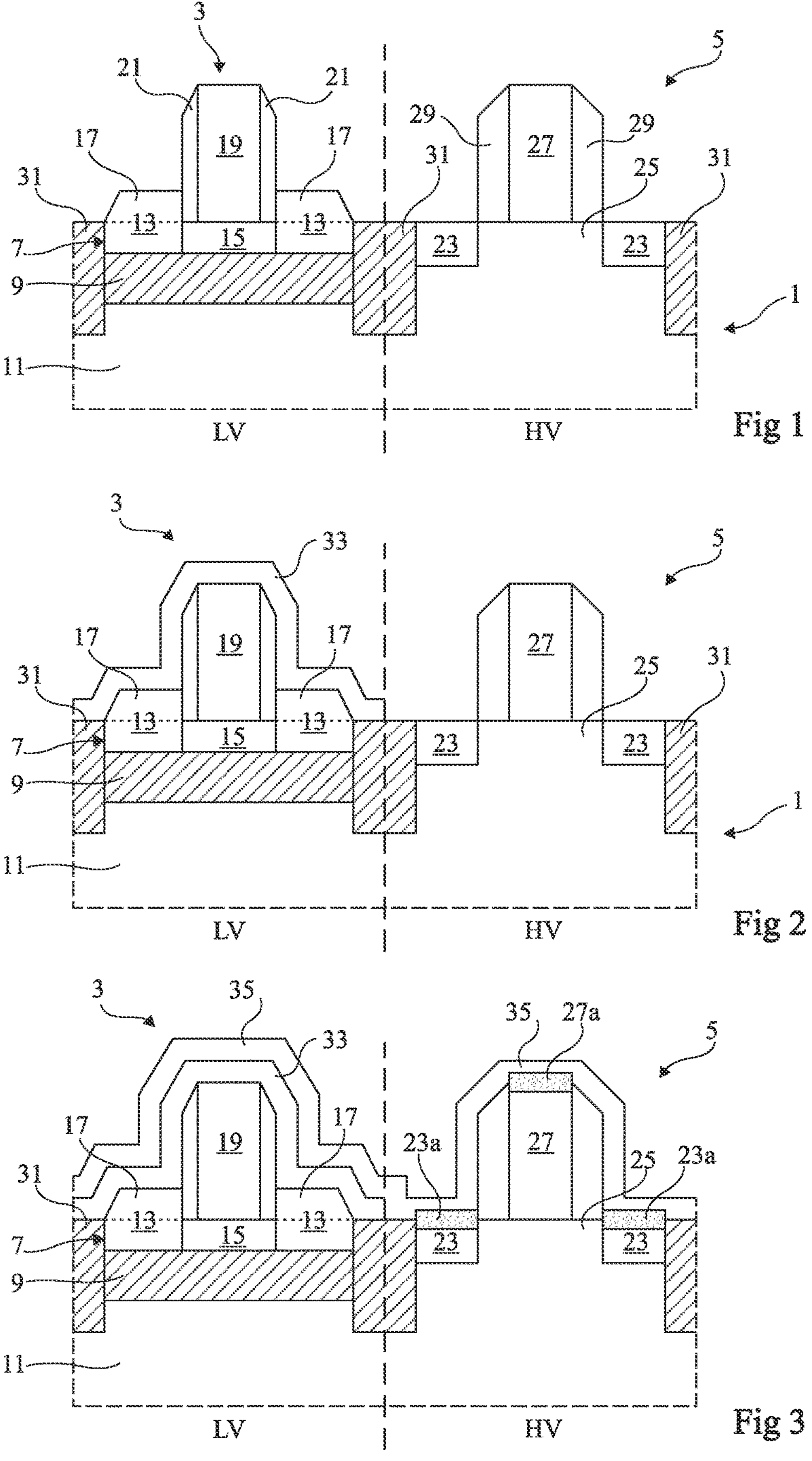
FIGS. 1 to 5 are simplified cross-section views of a portion of a semiconductor wafer at successive steps of an embodiment of a manufacturing method. In particular.

The same elements have been designated with the same reference numerals in the various drawings and, further, the various drawings are not to scale. For clarity, only those steps and elements which are useful to the understanding of the described embodiments have been shown and are detailed. In particular, the various usual integrated components where it is provided to silicide regions comprising silicon have not been described, the described method being compatible with such usual components and their operations.

In the following description, when reference is made to terms qualifying absolute positions, such as terms “front”, “back”, “top”, “bottom”, “left”, “right”, etc., or relative positions, such as terms “above”, “under”, “upper”, “lower”, etc., or to terms qualifying directions, such as terms “horizontal”, “vertical”, etc., it is referred to the orientation of the drawings. The terms “approximately”, “substantially”, “about”, and “on the order of” are used herein to designate a tolerance of plus or minus 10%, preferably of plus or minus 5%, of the value in question.

In the following description, the case of a wafer or plate at least partially made of a semiconductor material comprising at least one integrated circuit comprising components of a first type and components of a second type is considered. The components of the first type are called “high voltage” components and are intended to withstand high voltages, for example, higher than approximately 5 V, preferably higher than 5 V, such voltages being, for example, in the range from approximately 5 V to approximately 11 V, preferably from 5 to 11 V. The components of the second type are called “low voltage” components and are intended to withstand lower voltages than high-voltage components, for example, voltages lower than approximately 2 V, preferably lower than 2 V, for example, voltages of approximately 1.2 V, or even approximately 0.8 V, preferably 1.2 V or even 0.8 V.

FIG. 1 is a simplified cross-section view of a portion of a wafer 1 at least partially made of a semiconductor material, at a step of an embodiment of a manufacturing method.

Wafer 1 comprises a LV ("low voltage") portion, to the left of FIG. 1, having the low-voltage components, here, a transistor 3, formed therein. In portion LV, wafer 1 comprises a thin silicon layer 7 resting on top of and in contact with an insulating layer 9, for example, made of silicon oxide, with insulating layer 9 resting on top of and in contact with a silicon substrate 11. Layers 7 and 9 form an SOI-type structure ("Silicon On Insulator"). As an example, the thickness of layer 7, that is, the thickness of layer 7 measured in the channel region, is smaller than approximately 20 nm or even smaller than approximately 10 nm, preferably smaller than 20 nm or even smaller than 10 nm, for example, equal to approximately 7 nm, preferably equal to 7 nm. The small thickness of layer 7 enables transistor 3 to operate in a fully depleted mode, layers 7 and 9 then forming a FDSOI-type structure ("Fully-Depleted Silicon On Insulator").

Transistor 3 is formed inside and/or on top of layer 7. Transistor 3 comprises source and drain regions 13 separated from each other by a channel-forming region 15. Source and drain regions 13 each comprise a portion 17 of silicon epitaxially grown from layer 7. Channel-forming region 15 is topped with a gate stack 19 having at least its top made of silicon, for example, of polysilicon. Spacers 21 cover the sides of gate stack 19. Spacers 21 separate and electrically insulate gate stack 19 from epitaxial portions 17. As an example, the thickness of epitaxial portions 17, for example, measured from the upper surface of layer 7, is in the range from approximately 10 nm to approximately 20 nm, preferably in the range from 10 to 20 nm, for example, in the range from approximately 14 to 16 nm, preferably in the range from 14 to 16 nm.

Wafer 1 also comprises a HV ("high voltage") portion, to the right in FIG. 1, where the high-voltage components, here, a transistor 5, are formed. In portion HV, wafer 1 is deprived of SOI-type structure, that is, of layers 7 and 9. As an example, in the HV portion of wafer 1, layers 7 and 9 have been removed by etching before the forming of transistor 5, where an optional epitaxy step may be provided after the etching so that, after the epitaxy, the upper surface of substrate 11 in the HV portion is at substantially the same level, for example, to within 5 nm, as the upper surface of layer 7 of the LV portion. As an example, transistor 5 is a transistor for controlling the reading from or writing into a flash-type memory cell.

Transistor 5 is formed inside and/or on top of substrate 11. Transistor 5 comprises source and drain regions 23 separated from each other by a channel-forming region 25. Region 25 is topped with a gate stack 27 having at least its top made of silicon, for example, of polysilicon. Spacers 29 cover the sides of gate stack 27. As an example, the thickness or width of spacers 29 is greater than that of spacers 21.

In the shown example, transistors 3 and 5 are separated and electrically insulated from each other by insulating walls 31, for example, formed by trench isolation structures.

FIG. 2 is a simplified cross-section view showing the structure of FIG. 1 after the forming of a mask 33, generally called hard mask, at least on the LV portion of wafer 1 but not on its HV portion. Thus, in the HV portion, regions to be silicided, here regions 23 and the top of gate stack 27, have their upper surfaces exposed.

As an example, mask 33 is deposited all over wafer 1, after which the portion of mask 33 covering the HV portion of wafer 1 is removed by etching. Mask 33 is, for example, formed of a stack of two layers, a lower silicon oxide layer having a thickness for example on the order of 3 nm, and an upper silicon nitride layer having a thickness, for example, on the order of 30 nm.

FIG. 3 is a simplified top view showing the structure of FIG. 2 after a first siliciding step, the first siliciding being performed in the HV portion of wafer 1 but not in its portion LV.

A metal layer 35 is deposited on the HV portion, preferably all over wafer 1. Thus, in the HV portion of wafer 1, layer 35 covers and is in contact with the regions to be silicided. Preferably, layer 35 comprises nickel in contact with these regions to be silicided.

As an example, metal layer 35 comprises a stack of two metal layers, a lower nickel and platinum metal layer and an upper titanium nitride layer enabling to avoid for the nickel of the lower layer to oxidize. The thickness of the nickel and platinum layer is, for example, in the range from approximately 15 nm to approximately 20 nm, preferably from 15 to 20 nm, for example, equal to approximately 16 nm, preferably equal to 16 nm. The thickness of the titanium nitride layer is, for example, in the range from approximately 10 nm to approximately 20 nm, preferably from 10 to 20 nm, for example, equal to approximately 10 nm, preferably equal to 10 nm.

An anneal is then performed so that metal layer 35 reacts with the silicon of the regions to be silicided with which layer 35 is in contact. As an example, the anneal is performed at a temperature in the range from 250 to 300° C., for example, on the order of 270° C., preferably 270° C. As an example, the duration of the anneal is in the range from 45 to 75 seconds, for example, approximately equal to 60 seconds, preferably equal to 60 seconds.

This results, in the HV portion of wafer 1, in a siliciding of the regions which comprise silicon and which are in contact with layer 35, in other words the forming of silicide in each of these regions, it being understood that the region comprising silicon is not entirely turned into silicide. In this example, after the anneal, each of regions 23 comprises a silicided portion **23*a* and the top of gate stack 27 comprises a silicided portion 27*a*. As an example, the thickness of silicided portions 23*a*, 27*a*** is approximately 24 nm, preferably equal to 24 nm.

Figure 4:
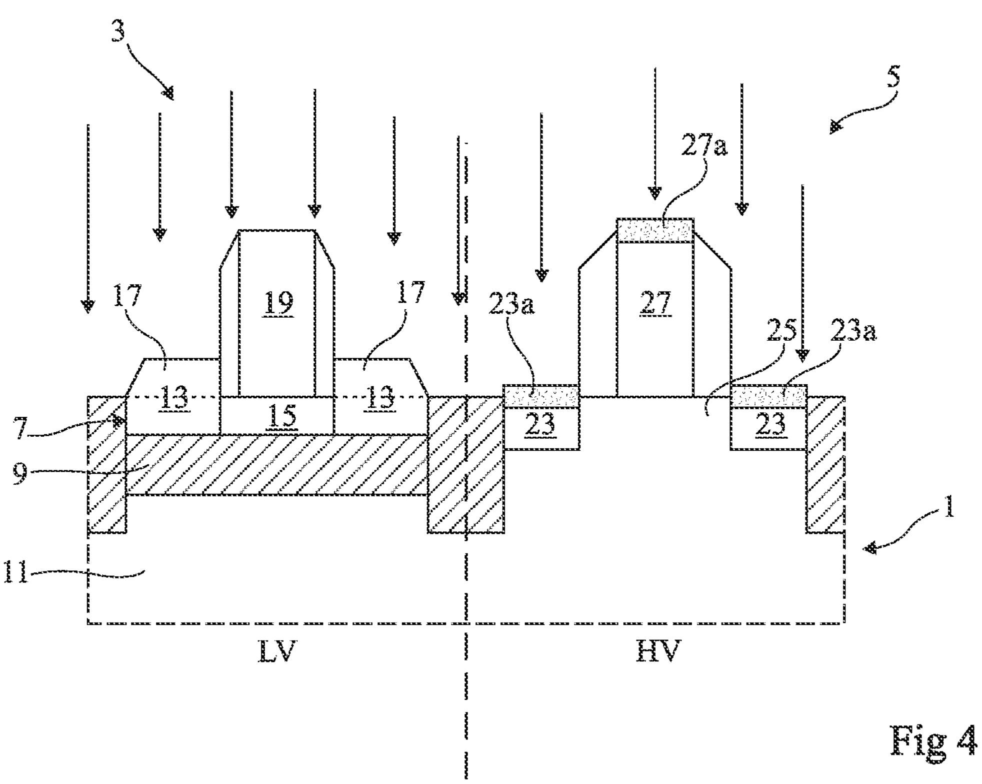

FIG. 4 is a simplified cross-section view of the structure of FIG. 3 after the removal of metal layer 35 and of mask 33, during an implantation step carried out simultaneously for the HV and LV portions of wafer 1.

The removal of metal layer 35 enables to remove the excess material which has not reacted with silicon to form silicide. As an example, the removal of layer 35 is performed by wet etching.

The removal of mask 33 enables to expose, in the LV portion of wafer 1, regions to be silicided, that is, here, regions 13 and the top of gate stack 19. As an example, the removal of mask 33 is performed by wet etching.

During the implantation (schematically shown by vertical arrows in FIG. 4), atoms, for example, from group III, IV, and/or V, preferably germanium and/or carbon atoms, are simultaneously implanted in the regions already silicided in the HV portion and in the regions to be silicided to the LV portion. The implantation is amorphizing, that is, it breaks the crystal structure of silicon where the atoms are implanted, for example, in the drain and source regions of the LV portion. More particularly, the crystal structure of the silicon is broken across a small thickness, for example, on the order of 10 nm, from the exposed surface of the silicon. Since the crystal structure of the silicon is broken across a small thickness, the PN junctions of transistor 3, for example located more than 10 nm away from the silicon areas made amorphous by the implantation, are not modified by this implantation.

As an example, germanium is implanted with an implantation energy in the range from approximately 1 keV to approximately 5 keV and/or carbon is implanted with an implantation energy in the range from approximately 1 keV to approximately 2 keV.

An advantage of carbon and germanium atoms is that they are not electrically active towards silicon, that is, they are not N- or P-type dopant atoms. This enables to not modify the N and/or P-type dopant concentrations in the silicon regions already doped when the implantation is performed, particularly at the level of the PN junctions of the transistors.

Figure 5:
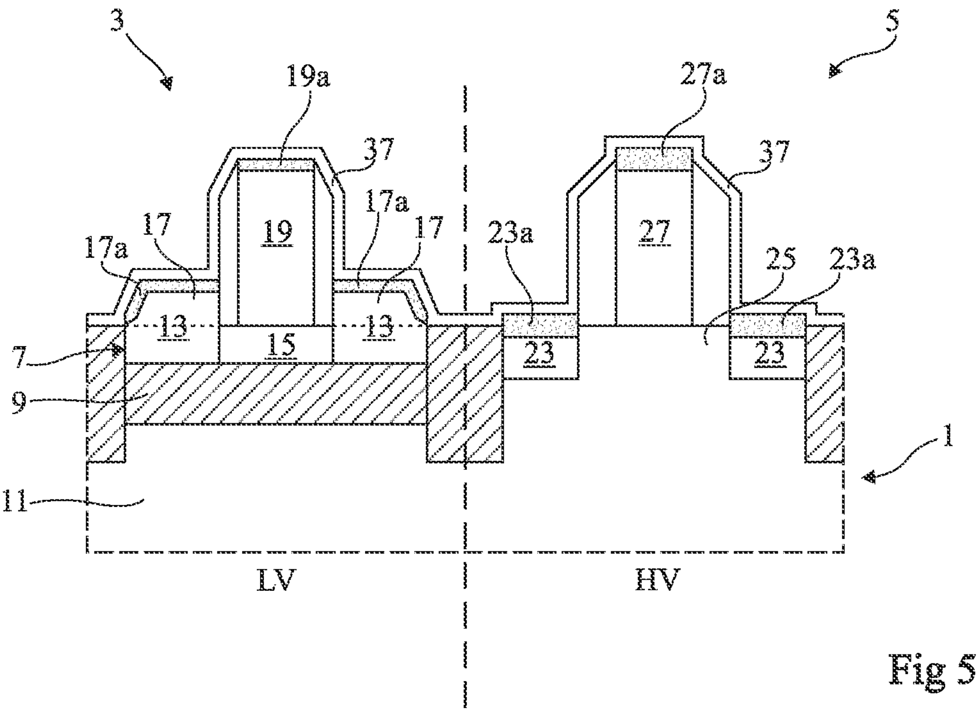

FIG. 5 is a simplified cross-section view showing the structure of FIG. 4 after a second siliciding step during which, in the LV portion of wafer 1, silicide is formed in exposed regions comprising silicon.

A metal layer 37 is deposited all over wafer 1. Layer 37 covers and is in contact with silicide 27*a*, 23*a* already formed in the HV portion, layer 37 covering and being in contact also with the regions to be silicided of the LV portion. Preferably, layer 37 comprises nickel in contact with the silicon of the regions to be silicided of the LV portion. Preferably, the thickness of layer 37 is smaller than that of layer 35.

In this example, layer 37 has a structure identical to that of layer 35 and thus comprises a lower nickel and platinum layer and an upper titanium nitride layer. The thickness of the nickel and platinum layer of layer 37 is, for example, in the range from approximately 5 nm to approximately 10 nm, preferably from 5 to 10 nm, for example equal to approximately 7 nm, preferably equal to 7 nm. The thickness of the titanium nitride layer of layer 37 is, for example, in the range from approximately 3 nm to approximately 8 nm, preferably from 3 to 8 nm, for example, equal to approximately 5 nm, preferably equal to 5 nm.

An anneal is then performed so that metal layer 37 reacts with the silicon that it covers. As an example, the anneal is performed at a temperature in the range from 200 to 250° C., for example, on the order of 230° C., preferably 230° C. As an example, the duration of the anneal is in the range from 10 to 30 seconds, for example, equal to approximately 20 seconds, preferably equal to 20 seconds.

This results, in the LV portion of wafer 1, in a siliciding of the regions which comprise silicon and which are in contact with layer 37, in other words the forming of silicide in each of these regions, it being understood that the region is not entirely turned into silicide. In this example, after the anneal, each of regions 13, and more particularly the epitaxial portion 17 of these regions 13, comprises a silicided portion 17*a* and the top of gate stack 19 comprises a silicided portion 19*a*. As an example, the thickness of silicided portions 17*a*, 19*a* is approximately 11 nm, preferably 11 nm.

In this embodiment, the second anneal described in relation with FIG. 5 is shorter and carried out at a lower temperature than the first anneal described in relation with FIG. 3. Due to the fact that the second anneal is carried out at a lower temperature than the first anneal, the second anneal does not modify the thickness and the composition of the silicide 23*a*, 27*a* formed during the first anneal. This is true despite the fact that, during the second anneal, metal layer 37 is present on the silicide 23*a*, 27*a* formed during the first anneal. The possibility of depositing layer 37 over the entire wafer 1 avoids the use of an additional step of masking the HV portion of wafer 1.

At a next step, not shown, metal layer 37 is removed, for example, by wet etching, to remove the excess metal which has not reacted. An additional anneal step is, for example, carried out to favor, in the HV portion of wafer 1, the accumulation of the atoms implanted during the step of FIG. 4, at the interface between silicide 23*a* and 27*a* and the silicon on which it rests. During the additional anneal, the temperature is, for example, in the range from 350 to 420° C., for example, approximately 390° C., preferably 390° C. As an example, the duration of the anneal is in the range from 20 to 60 seconds, for example, approximately 30 seconds, preferably 30 seconds.

The described method enables obtainment of a thick silicide, for example, having a thickness greater than 20 nm, for example, having a thickness in the range from 20 to 30 nm, in the HV portion of wafer 1 and a thin silicide, for example, having a thickness smaller than 20 nm, for example, having a thickness in the range from 11 to 20 nm in the LV portion of wafer 1.

The provision of a thin silicide in the LV portion enables avoiding the silicide 17*a* of source and drain regions 13 extending all the way to insulating layer 9 and/or to channel forming region 15, which would degrade the performance of transistor 3.

In the HV portion, the thick silicide, which is less resistive than a thin silicide, is adapted to the voltages applied to the high-voltage components. As an example, the resistivity of the silicide in the HV portion is on the order of 14 μ·Ω·cm when its thickness is on the order of 24 nm, preferably of 24 nm, while the resistivity of the silicide in the LV portion is in the range from 30 to 60 μ·Ω·cm when its thickness is approximately 11 nm, which is not adapted to high-voltage components.

Further, in the above-described method, the provision, after the siliciding performed in the HV portion, of an implantation step such as described in relation with FIG. 4 results in that, in the HV portion, the implanted atom concentration is maximum at the interface between the silicided portion 23*a* and 27*a* and the non-silicided portion of regions 23, 27. This results in a lowering of the Schottky barrier between the silicided portion and the non-silicided portion of these regions as compared with the case where this implantation would not be performed.

Conversely, due to the fact that the implantation described in relation with FIG. 4 is performed before the siliciding performed in the LV portion, the implanted atoms and the metal of layer 37 are distributed across the entire thickness of the silicide 17*a*, 19*a* formed in the LV portion. This results in a silicide 17*a*, 19*a* with a better stability. This implantation step also provides a smoother interface between silicided portion 17*a*, 19*a* and the non-silicided portion of regions 17, 19.

Further, the described implantation being amorphizing, this causes a decrease, or even a suppression, of the penetration of silicide 13*a* of the drain and source regions 13 from transistor 3 to channel-forming region 15 of this transistor and/or to layer 9, which would degrade the performance of transistor 3.

Specific embodiments have been described. Various alterations, modifications, and improvements will occur to those skilled in the art. In particular, it may be provided for each of the source and drain regions of high-voltage transistor 5 to comprise a portion epitaxially grown from substrate 11.

More generally, the above-described method applies to regions to be silicided of other components than those described hereabove, for example, to those of a diode formed in the LV portion, of an ONO-type (Oxide-Nitride-Oxide) capacitance formed in the HV portion, of a flash memory cell formed in the HV portion, to those of a power transistor formed in the HV portion, etc.

The materials and/or the thicknesses of the various above-described layers as well as the temperatures and/or the durations of the above-described anneals may be adapted, for example, according to the targeted silicide thicknesses in the LV portion and/or in the HV portion.

Hard mask 33 may be made of a layer and/or of other materials than those indicated hereabove provided that it prevents the forming of silicide in the LV portion at the step described in relation with FIG. 3. As an example, mask 33 may be a single silicon oxide layer.

Although an embodiment where metal layer 37 is deposited on the already silicided regions of the HV portion of wafer 1 has been described, it may be provided to mask the HV portion before the deposition of this layer.

Further, it may be provided for the wafer to comprise additional areas where no siliciding is performed. This would for example be true for an area where only optical components would be formed, for an area where components used for electrostatic discharges are formed, or for an area comprising precision resistors.

Such alterations, modifications, and improvements are intended to be part of this disclosure, and are intended to be within the spirit and the scope of this disclosure. Accordingly, the foregoing description is by way of example only and is not intended to be limiting.

The invention claimed is:

1. A method of manufacturing an integrated circuit, comprising:

providing a semiconductor wafer including first and second semiconductor regions, the first semiconductor region including a silicon-on-insulator structure having an insulating layer on top of and in contact with the semiconductor wafer and a silicon layer on top of and in contact with the insulating layer;

forming first and second transistors respectively within the first and second semiconductor regions;

wherein the first transistor has first source and first drain regions separated by a first channel-forming region, with the first source region, first drain region, and first channel-forming region being formed in the silicon layer, the first source and first drain regions each including a portion of silicon epitaxially grown from the silicon layer such that the first source and first drain regions are raised with respect to a surface of the semiconductor wafer, the first channel-forming region being topped by a first gate stack, and first spacers covering sides of the first gate stack to separate and electrically insulate the first gate stack from the epitaxially grown portions of the first source and first drain regions;

wherein the second transistor has second source and second drain regions separated by a second channel-forming region, with the second source region, second drain region, and second channel-forming region being formed in the semiconductor wafer, the second channel-forming region being topped with a second gate stack, and second spacers covering sides of the second gate stack;

depositing a mask over the first and second semiconductor regions such that the mask covers the first and second transistors, and etching a portion of the mask covering the second semiconductor region to expose silicon regions to be silicided in the second semiconductor region;

performing a first siliciding in the second semiconductor region to form first silicided regions by:

depositing a first metal layer in the first and second semiconductor regions, with the first metal layer in the first semiconductor region being deposited to directly contact the mask and, in the second semiconductor region, being deposited in openings formed in the mask by etching to directly contact the second gate stack, second spacers, and second source and second drain regions of the second transistor; and performing a first annealing so that the first metal layer reacts with silicon in the second semiconductor region that the first metal layer is in contact with to form the first silicided regions atop the second source and second drain regions of the second transistor as well as to form the first silicided region atop the second gate stack of the second transistor;

removing the first metal layer and the mask to expose in the first semiconductor region, regions atop the first source and first drain regions of the first transistor as well as a region atop the first gate stack of the first transistor;

performing an implantation on the first silicided regions within the second semiconductor region and the regions to be silicided in the first semiconductor region, the implantation within the first semiconductor region being into the epitaxially grown portions of the first source and first drain regions of the first transistor;

wherein the implantation is amorphizing and breaks a crystal structure of silicon in the second semiconductor region across a given thickness thereof extending from an exposed surface of the second semiconductor region down to a given depth, wherein the given thickness is less than a total thickness of the second semiconductor region;

performing a second siliciding in the first semiconductor region to form second silicided regions by:

depositing a second metal layer over the first and second semiconductor regions; and performing a second annealing so that the second metal layer reacts with silicon in the first semiconductor region that the second metal layer is in contact with to thereby form the second silicided regions atop the epitaxially grown portions of the first source and first drain regions of the first transistor as well as form the second silicided region atop the first gate stack of the first transistor;

removing the second metal layer to remove unreacted portions thereof, and performing a third annealing to favor, in the second semiconductor region, accumulation of atoms implanted, during the implantation on the first silicided region within the second semiconductor region, at an interface between the first silicided region and the silicon on which they rest.

2. The method of claim 1, wherein a width of the second spacers is greater than a width of the first spacers.

3. The method of claim 1, wherein the silicon-on-insulator structure results in the first transistor operating in a fully depleted mode such that the silicon layer and insulating layer form a fully-depleted silicon-on-insulator structure.

4. The method of claim 1, further comprising forming an insulating wall in the semiconductor wafer to separate and insulate the first and second transistors from one another.

5. The method of claim 1, wherein the second annealing is shorter and carried out at a lower temperature than the first annealing so that the second annealing does not modify thickness and composition of the first silicided regions formed during the first annealing.

6. The method of claim 5, wherein the third annealing is longer than the second annealing but shorter than the first annealing and is carried out a temperature higher than the first and second annealings.

7. The method of claim 1, wherein the removal of the first metal layer is performed by wet etching; and wherein the removal of the second metal layer is performed by wet etching.

8. The method of claim 1, wherein the first transistor is a low-voltage transistor and the second transistor is a high-voltage transistor.

9. The method of claim 1, wherein, as a result of the implantation being performed within the first semiconductor region into the epitaxially grown portions of the first source and first drain regions of the first transistor, PN junctions of the first transistor are not modified by the implantation due to a distance between the PN junctions of the first transistor and the epitaxially grown portions of the first source and first drain regions of the first transistor.

* * * * *